US008912082B2

(12) United States Patent
Bateman et al.

(10) Patent No.: US 8,912,082 B2
(45) Date of Patent: Dec. 16, 2014

(54) IMPLANT ALIGNMENT THROUGH A MASK

(75) Inventors: Nicholas P. T. Bateman, Reading, MA (US); William T. Weaver, Austin, TX (US); Paul Sullivan, Wenham, MA (US); John W. Graff, Swampscott, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 772 days.

(21) Appl. No.: 13/070,206

(22) Filed: Mar. 23, 2011

(65) Prior Publication Data

US 2011/0237022 A1   Sep. 29, 2011

Related U.S. Application Data

(60) Provisional application No. 61/317,549, filed on Mar. 25, 2010.

(51) Int. Cl.
*H01L 21/265* (2006.01)
*H01L 31/0224* (2006.01)
*H01L 21/266* (2006.01)
*H01L 31/18* (2006.01)
*H01L 31/068* (2012.01)

(52) U.S. Cl.
CPC ............ *H01L 21/266* (2013.01); *Y02E 10/547* (2013.01); *H01L 31/022441* (2013.01); *H01L 31/1804* (2013.01); *H01L 31/0682* (2013.01)
USPC ............ 438/519; 438/527; 438/531; 438/548

(58) Field of Classification Search
CPC ............ H01L 21/0415; H01L 21/046; H01L 21/0465; H01L 21/68; H01L 2223/54426
USPC ......... 438/510, 514, 519, 527, 531, 542, 548, 438/549
See application file for complete search history.

(56) References Cited

U.S. PATENT DOCUMENTS

| | | | |
|---|---|---|---|
| 5,994,175 A * | 11/1999 | Gardner et al. | 438/199 |
| 7,190,458 B2 | 3/2007 | Borden et al. | |
| 7,727,866 B2 | 6/2010 | Bateman et al. | |
| 7,820,460 B2 | 10/2010 | Sullivan et al. | |
| 2002/0050573 A1* | 5/2002 | Suguro et al. | 250/492.21 |
| 2003/0228731 A1* | 12/2003 | Hayashi | 438/224 |
| 2008/0213936 A1* | 9/2008 | Hatai | 438/60 |
| 2009/0308439 A1 | 12/2009 | Adibi et al. | |
| 2010/0154870 A1 | 6/2010 | Bateman et al. | |
| 2011/0180131 A1 | 7/2011 | Mullin et al. | |
| 2011/0186118 A1 | 8/2011 | Kim | |

FOREIGN PATENT DOCUMENTS

| | | |
|---|---|---|
| JP | 4-115517 A | 4/1992 |
| WO | 2009033134 A2 | 3/2009 |
| WO | 2010108151 A1 | 9/2010 |

* cited by examiner

*Primary Examiner* — Colleen A Matthews
*Assistant Examiner* — Quovaunda V Jefferson

(57) ABSTRACT

Methods to form complementary implant regions in a workpiece are disclosed. A mask may be aligned with respect to implanted or doped regions on the workpiece. The mask also may be aligned with respect to surface modifications on the workpiece, such as deposits or etched regions. A masking material also may be deposited on the implanted regions using the mask. The workpiece may be a solar cell.

18 Claims, 5 Drawing Sheets

IMPLANT ALIGNMENT THROUGH A MASK

CROSS-REFERENCE TO RELATED APPLICATIONS

This application claims priority to the provisional patent application entitled "Alignment of Chained Implants through a Shadow Mask," filed Mar. 25, 2010 and assigned U.S. App. No. 61/317,549, the disclosure of which is hereby incorporated by reference.

FIELD

This invention relates to solar cells and, more particularly, to solar cells formed using ion implantation.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the ion beam penetrate into the bulk of the workpiece material and are embedded into the crystalline lattice of the workpiece material to form a region of desired conductivity.

Solar cells are one example of a device that uses silicon workpieces. Any reduced cost to the production of high-performance solar cells or any efficiency improvement to high-performance solar cells would have a positive impact on the implementation of solar cells worldwide. Ion implantation is one such process that can reduce the cost while improving the efficiency of solar cells. This will enable the wider availability of this clean energy technology.

Solar cells typically consist of a p-n semiconducting junction. FIG. 1 is a cross-sectional view of an interdigitated back contact (IBC) solar cell. In the IBC solar cell 205, the junction is on the back or non-illuminated surface. In this particular embodiment, the IBC solar cell 205 has an n-type base 206, an n+ front surface field 207, a passivating layer 208, and an anti-reflective coating (ARC) 209. The passivating layer 208 may be $SiO_2$ in one instance, though other dielectrics may be used. Photons 214 enter the IBC solar cell 205 through the top (or illuminated) surface, as signified by the arrows. These photons 214 pass through the ARC 209, which is designed to minimize the number of photons 214 that are reflected away from the IBC solar cell 205. The ARC 209 may be comprised of a $SiN_x$ layer in one instance. The photons 214 enter through the n+ front surface field 207. The photons 214 with sufficient energy (above the bandgap of the semiconductor) are able to promote an electron within the valence band of the semiconductor material to the conduction band. Associated with this free electron is a corresponding positively charged hole in the valence band.

On the back side of the IBC solar cell 205 is an emitter region 215. The doping pattern of the emitter region 215 is alternating p-type and n-type dopant regions in this particular embodiment. The n+ back surface field 204 may be approximately 450 μm in width and doped with phosphorus or other n-type dopants. The p+ emitter 203 may be approximately 1450 μm in width and doped with boron or other p-type dopants. This doping may enable the junction in the IBC solar cell 205 to function or have increased efficiency. This IBC solar cell 205 also includes a passivating layer 212, n-type contact fingers 210, p-type contact fingers 211, and contact holes 213 through the passivating layer 212.

To form the IBC solar cell, at least two patterned doping steps may be required. These patterned doping steps need to be aligned to prevent the p+ emitter 203 and the n+ back surface field 204 from overlapping. In one instance, the alignment needs to be between approximately 5-50 μm. Poor alignment or overlapping may be prevented by leaving a gap between the p+ emitter 203 and the n+ back surface field 204, but this may degrade performance of the IBC solar cell depending on the size of the gap. Even when properly aligned, such patterned doping may have large manufacturing costs. For example, photolithography or hard masks (such as an oxide) may be used, but both are expensive and require extra process steps. Furthermore, it may be difficult to construct a shadow mask with long, thin fingers that may be used, for example, with certain implant steps. Therefore, there is a need in the art for an improved method of doping solar cells and, more particularly, an improved method of doping IBC solar cells using ion implantation.

SUMMARY

According to a first aspect of the invention, a method of manufacturing a workpiece is provided. The method comprises applying a contact mask with apertures to a surface of a workpiece. A first species is doped through the apertures of the contact mask to form a plurality of first doped regions in the workpiece. The doping may be either diffusion or implantation. A mask with apertures is aligned to the workpiece a distance from the workpiece. The first doped regions are not seen through the apertures of the mask. A second species is implanted through the apertures of the mask to form second implanted regions and the contact mask is removed from the surface.

According to a second aspect of the invention, a method of manufacturing a workpiece is provided. The method comprises disposing a first mask with apertures a distance from the workpiece. A first species is implanted through the apertures of the first mask to form a plurality of first implanted regions in the workpiece. The surface of these first implanted regions is modified. A second mask with apertures is aligned to the workpiece a distance from the workpiece. The first implanted regions are not seen through the apertures of the second mask. A second species is implanted through the apertures of the second mask to form second implanted regions.

According to a third aspect of the invention, a method of manufacturing a workpiece is provided. The method comprises disposing a mask with apertures a distance from the workpiece. A first species is implanted through the mask to form first implanted regions in the workpiece. A masking material is deposited on the surface of the first implanted regions using the apertures of the mask. A second species is implanted to form second implanted regions. The masking material blocks a portion of the second species from implanting the first implanted regions. The masking material is then removed.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of this method are described herein in connection with an ion implanter. Beamline ion implanters, plasma doping ion implanters, focused plasma systems, systems that modulate a plasma sheath, or flood ion implanters may be used. However, gaseous diffusion, furnace diffusion, laser doping, other plasma processing tools, or other methods known to those skilled in the art also may be used for the blanket or selective implant or doping steps. While specific n-type and p-type dopants are listed, other n-type or p-type dopants may be used instead and the embodiments herein are not limited solely to the dopants listed. Furthermore, while one particular embodiment of a solar cell is specifically listed, embodiments of this process may be applied to other solar cell designs or even other workpieces such as semiconductor wafers or flat panels. Thus, the invention is not limited to the specific embodiments described below.

Figure 1:
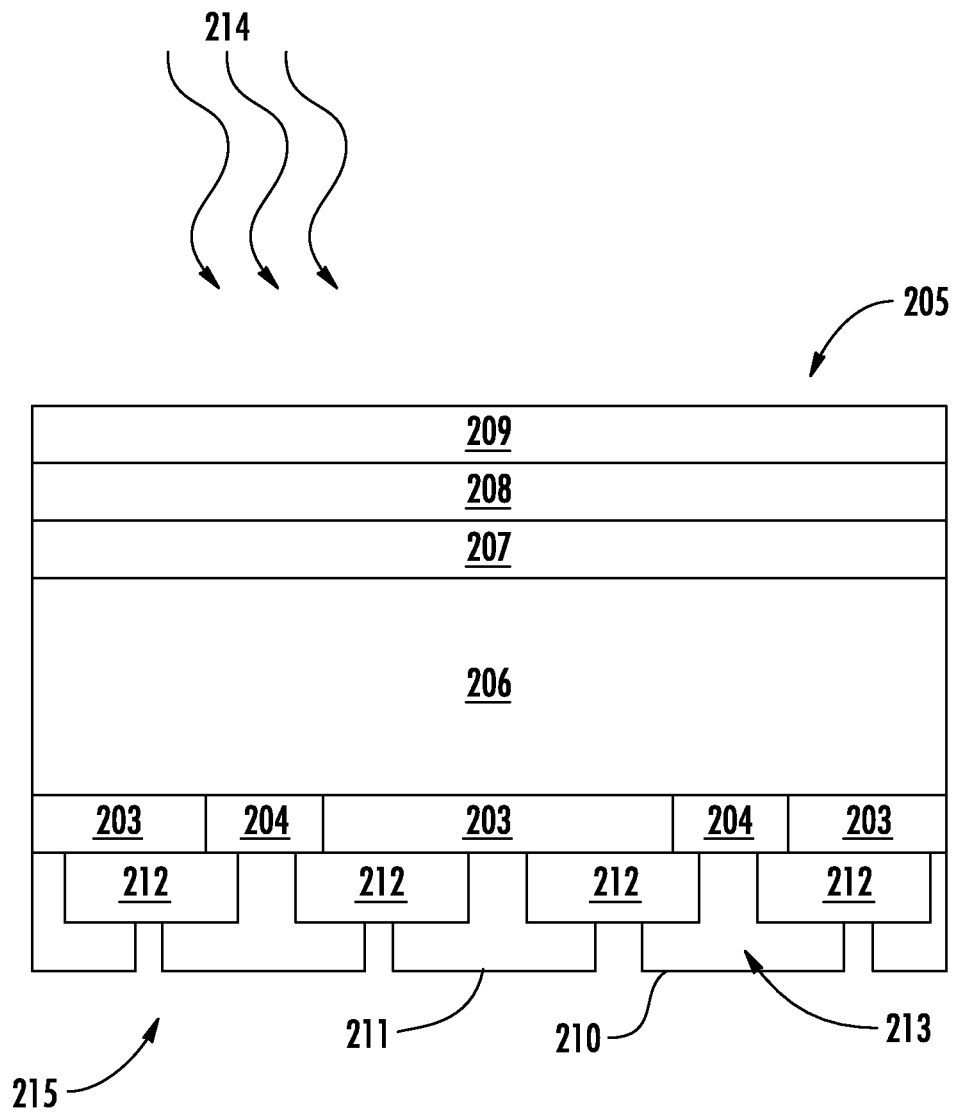
FIG. 1 is a cross-sectional view of an IBC solar cell.

To manufacture an IBC solar cell, two patterned or selective implants may be required to make the p+ emitter 203 and the n+ back surface field 204 illustrated in FIG. 1. For example, B or P may be implanted. These two implants may be complementary and may need to be aligned to within approximately 1-20 μm for certain high-performance IBC solar cells.

In the embodiments disclosed herein, the first implant may leave a visible mark on the workpiece. Such an implant may be for either the p+ emitter 203 or the n+ back surface field 204 seen in FIG. 1. The second implant is aligned to this visible mark in one instance. Thus, the visible mark from the first implant functions as a fiducial. The visible mark may be caused by, for example, amorphization, deposition, or other mechanisms. The first and second implants disclosed herein may form either the p+ emitter 203 or the n+ back surface field 204. Thus, these n-type and p-type implants may be performed in either order.

Figure 2A:
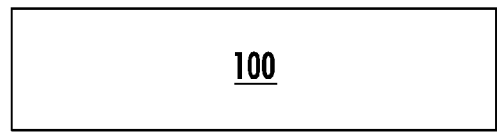
FIGS. 2A-E are a first embodiment of fabricating an IBC solar cell.
Figure 2B:
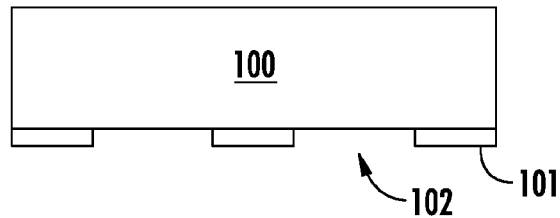

FIGS. 2A-E are a first embodiment of fabricating an IBC solar cell. In FIG. 2A, a workpiece 100 is provided. The workpiece 100 may be, for example, a silicon substrate that will be formed into a solar cell. A contact mask 101 is applied to the workpiece in FIG. 2B. This contact mask 101 has at least one aperture 102. The contact mask 101 may be a thin layer of ink applied using a rubber stamp or may be a patterned thin film that adheres to the workpiece 100. Screen printing, inkjet printing, or other methods may be used to form the contact mask 101. This contact mask 101 in one instance is relatively inexpensive to apply and thin compared to the thickness of the workpiece 100. In one particular embodiment, the contact mask 101 is an organic material, such as a polyvinyl alcohol. Thermal curing or UV curing of the contact mask 101 may harden it, though in other embodiments the contact mask 101 may dry or cool and harden. The contact mask 101 may have a thickness of approximately 1 μm above a surface of the workpiece 100. In other embodiments, the contact mask 101 has a thickness between approximately 100 nm and 50 μm or less than 100 nm above a surface of the workpiece 100. Certain contact mask 101 materials may be unable to print less than 100 nm without losing edge fidelity, but other materials are capable of being printed at such a thickness.

Figure 2C:
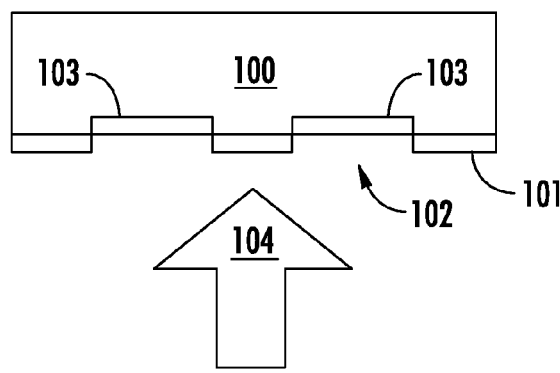

In FIG. 2C, a first implant of ions 104 is performed. This first implant of ions 104 may be a blanket implant of an entire surface of the workpiece 100. The ions 104 are implanted at an energy low enough to be blocked by the contact mask 101 and form the first regions 103 through the apertures 102 in the contact mask 101. For example, the energy may be <30 keV. The contact mask 101 may block more than 50%, more than 75%, more than 90%, or 100% of the ions 104 from implanting under the contact mask 101. In one embodiment, this first implant may not be aligned to the workpiece 100, but rather may just form the first regions 103 wherever the apertures 102 are. Thus, the contact mask 101 may be applied in an inexpensive, imprecise, or quick manner and later processing steps will compensate.

Figure 2D:
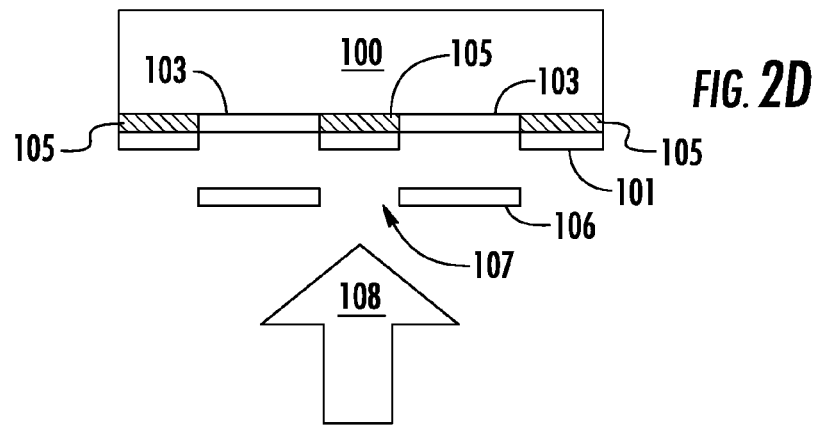

In FIG. 2D, a mask 106 with apertures 107 is positioned over the workpiece 100. The mask 106 may be a stencil or shadow mask, for example, and may be disposed a distance from the workpiece 100. The mask 106 also may be disposed on the workpiece 100. The apertures 107 are aligned to the contact mask 101. Ions 108 are implanted at a high enough energy to penetrate through the contact mask 101. For example, the energy may be >80 keV. In another instance, the mass of the ions 108 is different from the ions 104 but the implant energy is the same, which leads to the implant through the contact mask 101. In this embodiment, phosphorus and carborane or phosphorus and hexadecaborane, for example, may be used at the same implant energy. This mask 106 prevents ions 108 from implanting the workpiece 100 except in the second regions 105.

The ions 108 are the opposite type (n-type or p-type) from the ions 104 and will form the second regions 105. In the embodiment of FIG. 2 or other embodiments disclosed herein, the n-type species may be an atomic or molecular ion containing P or As and the p-type species may be an atomic or molecular ion containing B, Al, or Ga. Of course, other atomic or molecular species may be used. The optical alignment of the mask 106 to the contact mask 101 allows the first regions 103 to be aligned to the second regions 105. The mask 106 is aligned so the contact mask 101 is primarily visible through the apertures 107 while the amount of the workpiece 100 or first regions 103 visible through the apertures 107 is minimized.

Figure 2E:
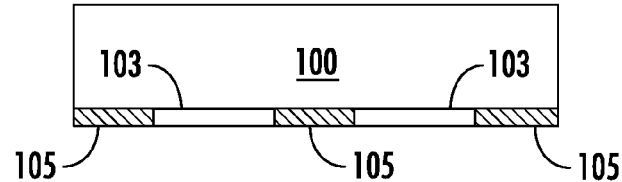

In FIG. 2E, the contact mask 101 is removed using, for example, a thermal step, ashing, a wet clean, or a plasma clean. The workpiece 100 now has aligned first regions 103 and second regions 105. These first regions 103 and second regions 105 may correspond to, for example, p+ emitter 203 or the n+ back surface field 204 seen in FIG. 1.

Figure 3A:
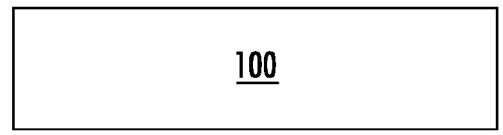
FIGS. 3A-E are a second embodiment of fabricating an IBC solar cell.
Figure 3B:
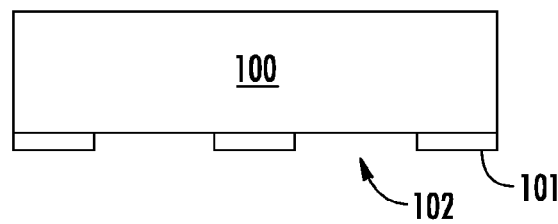

FIGS. 3A-E are a second embodiment of fabricating an IBC solar cell. In FIG. 3A, a workpiece 100 is provided. The workpiece 100 may be, for example, a silicon substrate that will be formed into a solar cell. A contact mask 101 is applied to the workpiece 100 in FIG. 3B. This contact mask 101 has at least one aperture 102. The contact mask 101 may be a thin layer of ink applied using a rubber stamp or may be a patterned thin film that adheres to the workpiece 100. Screen printing, inkjet printing, or other methods also may be used. In one particular embodiment, the contact mask 101 is an organic material. Thermal curing or UV curing of the contact mask 101 may harden it, though in other embodiments the contact mask 101 may dry or cool and harden.

Figure 3C:
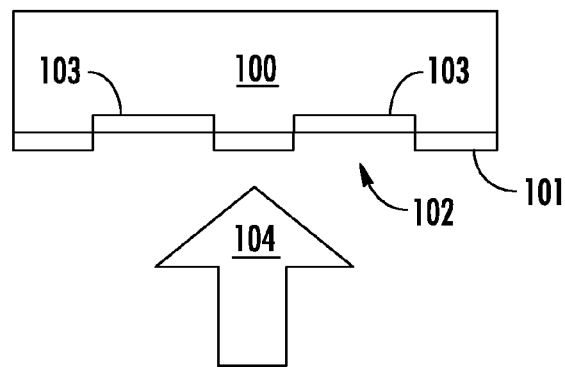

In FIG. 3C, a first implant of ions 104 is performed. This first implant of ions 104 may be a blanket implant of an entire surface of the workpiece 100. The ions 104 are implanted at an energy low enough to be blocked by the contact mask 101 and form the first regions 103 through the apertures 102 in the contact mask 101. In one embodiment, this first implant may not be aligned to the workpiece 100, but rather may just form the first regions 103 wherever the apertures 102 are. Thus, the contact mask 101 may be applied in an inexpensive, imprecise, or quick manner and later processing steps will compensate. The first regions 103 may be amorphized due to the implantation of the ions 104. Such amorphization may be visible on the workpiece 100. In one embodiment, a dose of ions 104 of approximately $1E14\ cm^{-2}$ to $2E16\ cm^{-2}$ is implanted into the workpiece 100 to amorphize.

Figure 3D:
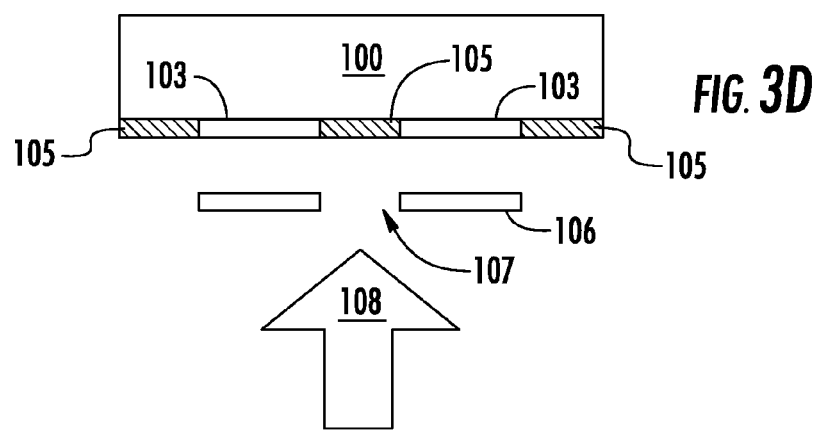

In FIG. 3D, the contact mask 101 is removed. A mask 106 with apertures 107 is positioned over the workpiece 100. The mask 106 may be a stencil or shadow mask, for example, and may be disposed a distance from the workpiece 100. The mask 106 also may be disposed on the workpiece 100. The apertures 107 are aligned to the first regions 103 such that the mask 106 primarily covers the first regions 103 and a minimum of amorphization is visible through the apertures 107. Ions 108 are implanted through the apertures 107 in the mask 106. These ions 108 are the opposite type (n-type or p-type) from the ions 104 and form the second regions 105. The optical alignment of the mask 106 to the first regions 103 allows the first regions 103 to be aligned to the second regions 105.

Figure 3E:
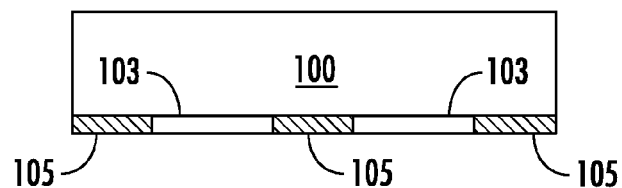

In FIG. 3E, the workpiece 100 now has aligned first regions 103 and second regions 105. These first regions 103 and second regions 105 may correspond to, for example, p+ emitter 203 or the n+ back surface field 204 seen in FIG. 1. While a contact mask 101 is specifically disclosed, photoresist, oxides, or other hard or soft masks may be used instead. Stencil masks or shadow masks also can be used to form the first regions 103 with amorphization without a contact mask 101.

Figure 4A:
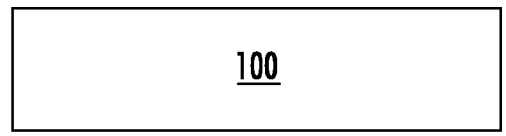
FIGS. 4A-D are a third embodiment of fabricating an IBC solar cell.
Figure 4B:
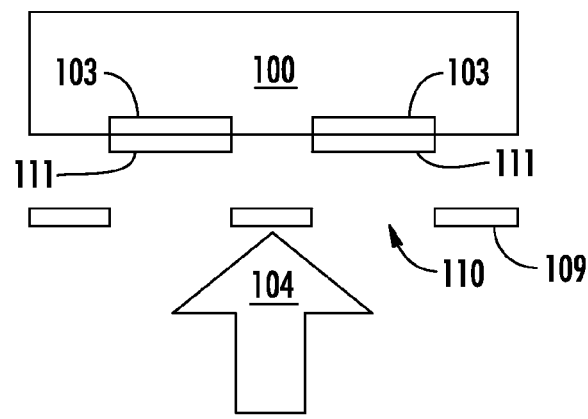

FIGS. 4A-D are a third embodiment of fabricating an IBC solar cell. In FIG. 4A, a workpiece 100 is provided. The workpiece 100 may be, for example, a silicon substrate that will be formed into a solar cell. In FIG. 4B, a mask 109 with apertures 110 is disposed above the workpiece 100. The mask 109 may be a stencil or shadow mask, for example, and also may be disposed on the workpiece 100 in an alternate embodiment. A first implant then occurs. In this particular embodiment, the implantation may use a plasma doping tool. During or after the first implant of the ions 104, the plasma parameters of the plasma doping tool are modified. These plasma parameters may include, for example, gas flow rate, gas composition, or plasma temperature. The plasma parameters may be modified sequentially or may be repeatedly cycled, for example. Due to this modification, the ions 104 in the plasma will either etch the workpiece 100 or form deposits on the workpiece 100. While deposition is illustrated in FIG. 4B, etching may occur in an alternate embodiment and, in one instance, approximately 50 nm or greater of the workpiece 100 is etched. The deposits 111 are formed under the apertures 110 and above the first regions 103. Thus, after the first implant is complete, the deposits 111 will cover the first regions 103. In an alternate embodiment that uses etching, a trench will be etched by the plasma in the first regions 103. The etching step may be performed prior to the first implant in an alternate embodiment to prevent etching of the first regions 103. The deposits 111 (or trenches) are visible using optical measurement systems.

Figure 4C:
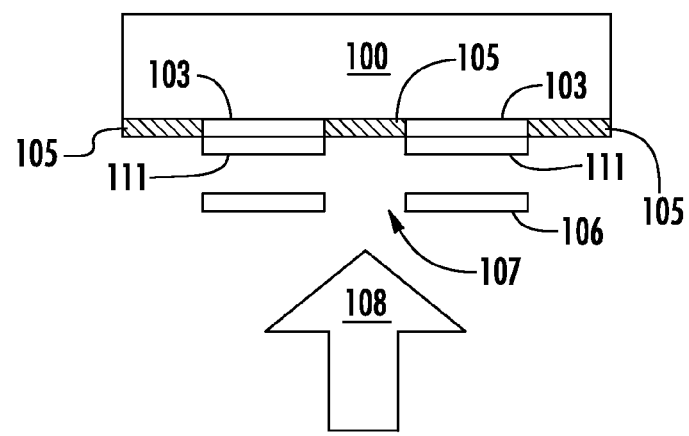

In FIG. 4C, A mask 106 with apertures 107 is positioned over the workpiece 100. The apertures 107 are aligned to the first regions 103 and deposits 111 (or trenches) such that the mask 106 primarily covers the first regions 103 and a minimum of the deposits 111 (or trenches) are visible through the apertures 107. Ions 108 are implanted through the apertures 107 in the mask 106. These ions 108 are the opposite type (n-type or p-type) from the ions 104 and form the second regions 105. The optical alignment of the mask 106 to the deposits 111 (or trenches) allows the first regions 103 to be aligned to the second regions 105.

Figure 4D:
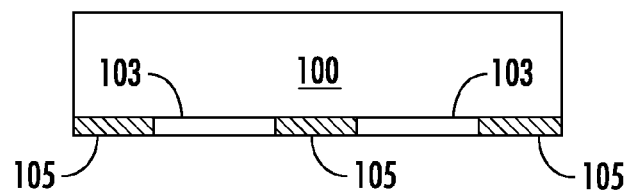

In FIG. 4D, the deposits 111 are removed using, for example, a thermal step, ashing, a wet clean, or a plasma clean, and the workpiece 100 now has aligned first regions 103 and second regions 105. These first regions 103 and second regions 105 may correspond to, for example, p+ emitter 203 or the n+ back surface field 204 seen in FIG. 1.

Figure 5A:
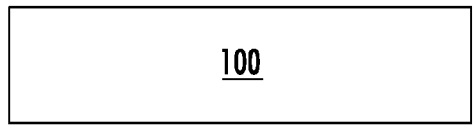
FIGS. 5A-E are a fourth embodiment of fabricating an IBC solar cell.
Figure 5B:
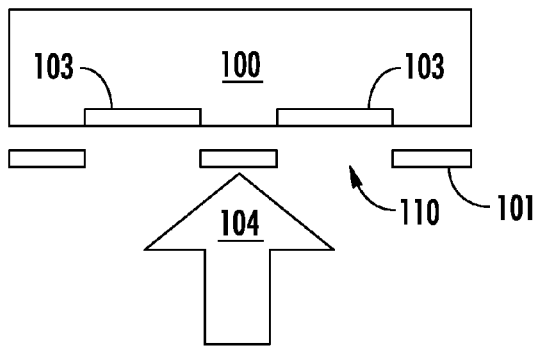

FIGS. 5A-E are a fourth embodiment of fabricating an IBC solar cell. In FIG. 5A, a workpiece 100 is provided. The workpiece 100 may be, for example, a silicon substrate that will be formed into a solar cell. In FIG. 5B, a mask 109 with apertures 110 is disposed above the workpiece 100. The mask 109 may be a stencil or shadow mask, for example, and also may be disposed on the workpiece 100 in an alternate embodiment. A first implant of ions 104 through the apertures 110 occurs and forms the first regions 103.

Figure 5C:
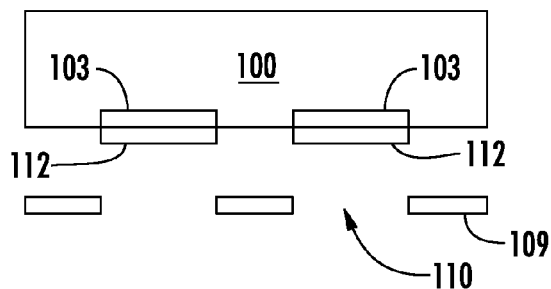

In FIG. 5C, the mask 109 is left in place. A masking material 112 is deposited onto the first regions 103 through or using the apertures 110 of the mask 109. This masking material 112 may be deposited using, for example, a deposition process, an aerosol spray containing particles, or other spray processes.

In one particular embodiment, a light-induced deposition process is used to form the masking material 112 on the workpiece 100. The masking material 112 in one embodiment is a metal, though other materials are possible. The mask 109 is illuminated by a light source, such as a UV, visible, infrared (IR), and/or other wavelength light source. A gas in introduced in the vicinity of the workpiece 100 and illuminated regions become coated with the masking material 112. Non-illuminated portions of the workpiece 100 are blocked by the mask 109. The gas may, in one instance, be photocatalyzed by the illumination.

Figure 5D:
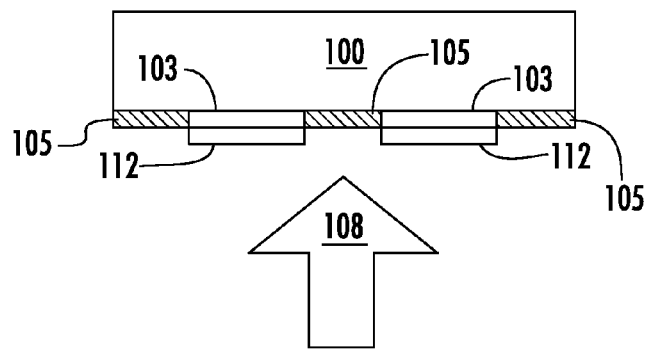

In FIG. 5D, a second implant of ions 108 is performed. This second implant of ions 108 may be a blanket implant of an entire surface of the workpiece 100. The ions 108 are implanted at an energy low enough to be mostly or totally blocked by the masking material 112 and form the second regions 105. These ions 108 are the opposite type (n-type or p-type) from the ions 104.

Figure 5E:
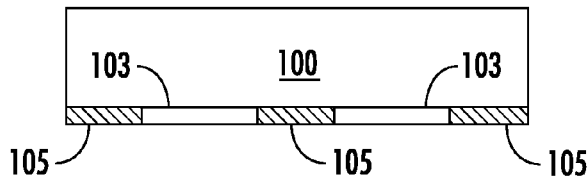

In FIG. 5E, the masking material 112 is removed using, for example, a thermal step, ashing, a wet clean, or a plasma clean, and the workpiece 100 now has aligned first regions 103 and second regions 105. These first regions 103 and second regions 105 may correspond to, for example, p+ emitter 203 or the n+ back surface field 204 seen in FIG. 1.

The workpiece 100 may be disposed on a platen in one instance. The mask 106 or platen may be moved or rotated in two dimensions using, for example, stepper motors. This may enable the alignment necessary for the second implants. The mask 106 or platen may be moved until a certain number of locations indicate that the mask 106 and workpiece 100 are aligned. In one instance, this is at three locations, but more or fewer locations also may be used.

The mask 106 disposed in front of the workpiece 100 may use optical techniques to determine proper alignment. In a first embodiment, high resolution imaging is used. One or more cameras with a suitable resolution (such as better than 20 μm) can take an image of the mask 106 and workpiece 100 at multiple locations. In a second embodiment, laser reflectance is used. A laser with split beams or an array of lasers can probe a number of locations on the mask 106. A light emitting diode (LED) reflective system or IR system also may be used. By measuring reflected light the mask 106 can be distinguished from the workpiece 100. Differences between implanted and non-implanted regions of the workpiece 100 also may be measured. In other embodiments, light in the ultraviolet (UV) or IR ranges or light in different colors to find the first regions 103. This measurement may use, for example, a charge-coupled device (CCD) camera or other camera system. Similar devices can find the contact mask 101, deposits 111, or trenches in or on the workpiece 100.

In one instance, alignment is measured at five locations on the workpiece 100 through the apertures 107 in the mask 106. These five locations may be the four corners and center of the mask 106. At each location, a high resolution image of the mask 106 and underlying workpiece 100 is collected. If the boundary between the first regions 103 and the unimplanted workpiece 100 is visible, for example, then the distance between the first regions 103 and the edge of the aperture 107 is measured in both the x and y directions. The mask 106 and the workpiece 100 is then moved in one of the three axes (x, y, θ) and a new measurement is taken. After collecting offset for a range of x, y, and θ, the data may be interpolated to calculate the correct relative position of the mask 106 and workpiece 100. The mask 106 or workpiece 100 is then moved to this position and locked in place or otherwise secured if alignment is verified.

Alignment between the mask 106 and workpiece 100 may be performed in-situ within the implanter or plasma processing tool. Alignment also may occur in a separate alignment chamber. These locations may be under vacuum or at atmosphere. In one particular embodiment, vacuum around the workpiece is not broken for any implant or mask placement steps disclosed in the embodiments herein.

The embodiments herein allow doped n-type and p-type regions that are complementary to one another. Embodiments of the process described herein may allow alignment of the n-type and p-type regions even if the widths of these regions are extremely small. Thus, the n-type and p-type regions are aligned and the p-n junction may be narrow due to the high dopant concentrations on either side of the junction. The n-type and p-type regions may be directly next to one another, parallel to one another, or otherwise distinct from one another in one particular instance. In another instance, there is a gap between the n-type and p-type regions of less than approximately 100 μm. The contact mask 101, mask 106, or implant steps, for example, may compensate for such a gap.

While distinct p+ emitters 203 and n+ back surface fields 204 are illustrated herein, there may be some overlap between the p+ emitters 203 and n+ back surface fields 204. This overlap may be approximately 50 μm in one instance. This can be accomplished by adjusting the dimensions of the apertures 107 in the mask 106, the placement of the contact mask 101, or both.

While implantation is specifically described, certain processes herein may be accomplished using other doping methods. For example, spray or gaseous diffusion or furnace diffusion may be used for certain steps. For example, diffusion may be used with a contact mask. In another instance, laser doping may be used for the selective doping step instead of ion implantation through a mask. Laser doping may selectively heat a paste applied to the workpiece to form doped regions in a particular pattern. The selective implantation of the species also may use a focused ion beam, which may or may not use a mask similar to the mask 106. Thus, other methods known to those skilled in the art may be used.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of manufacturing a workpiece comprising:
applying a contact mask to a surface of a workpiece, said contact mask defining a plurality of apertures;
implanting said workpiece with a first species through all of said apertures of said contact mask to form a plurality of first doped regions in said workpiece;
amorphizing said workpiece during said implanting said first species to create a visual mark on said substrate;
aligning a mask to said workpiece using said visual mark, said mask defining a plurality of apertures and being disposed a distance from said workpiece, wherein said mask is aligned so that said plurality of first doped regions cannot be seen through said apertures of said mask;
implanting a second species through said apertures of said mask to form a plurality of second implanted regions in said workpiece; and
removing said contact mask from said surface.

2. The method of claim 1, wherein said removing occurs before said implanting said second species.

3. The method of claim 1, wherein said workpiece is a solar cell.

4. The method of claim 1, wherein said first doped region and said second implanted region are complementary.

5. The method of claim 1, wherein one of said first species and said second species is an n-type species and the other of said first species and said second species is a p-type species.

6. The method of claim 5, wherein said n-type species is selected from the group consisting of P and As and said p-type species is selected from the group consisting of B, Al, and Ga.

7. A method of manufacturing a workpiece comprising:
disposing a first mask a distance from said workpiece, said first mask defining a plurality of apertures;
implanting a first species through said apertures of said first mask to form a plurality of first implanted regions in said workpiece;
modifying said surface of said first implanted regions through said apertures of said first mask, said modification creating a visual mark on said workpiece;
aligning a second mask to said workpiece, said second mask defining a plurality of apertures and being disposed a distance from said workpiece, wherein said mask is aligned using said visual mark so that said plurality of first implanted regions cannot be seen through said apertures of said second mask; and
implanting a second species through said apertures of said second mask to form a plurality of second implanted regions.

8. The method of claim 7, wherein said modifying said surface comprises one of etching said surface or forming a deposit on said surface.

9. The method of claim 8, wherein said modifying comprises said forming said deposit and further comprising removing said deposit after said implanting said second species.

10. The method of claim 7, wherein said workpiece is a solar cell.

11. The method of claim 7, wherein said first implanted region and said second implanted region are complementary.

12. The method of claim 7, wherein one of said first species and said second species is an n-type species and the other of said first species and said second species is a p-type species.

13. The method of claim 12, wherein said n-type species is selected from the group consisting of P and As and said p-type species is selected from the group consisting of B, Al, and Ga.

14. A method of manufacturing a workpiece comprising:
   disposing a mask a distance from said workpiece, said mask defining a plurality of apertures;
   implanting a first species through said apertures of said mask to form a plurality of first implanted regions in said workpiece;
   depositing a masking material on a surface of said first implanted regions using said apertures of said mask;
   implanting a second species to form a plurality of second implanted regions, wherein said masking material blocks a portion of said second species from implanting said first implanted regions; and
   removing said masking material.

15. The method of claim 14, wherein said workpiece is a solar cell.

16. The method of claim 14, wherein said first implanted region and said second implanted region are complementary.

17. The method of claim 14, wherein one of said first species and said second species is an n-type species and the other of said first species and said second species is a p-type species.

18. The method of claim 17, wherein said n-type species is selected from the group consisting of P and As and said p-type species is selected from the group consisting of B, Al, and Ga.

* * * * *